United States Patent
Yang

[11] Patent Number: 5,808,456
[45] Date of Patent: Sep. 15, 1998

[54] ADAPTIVE DC CLAMPING CIRCUIT

[75] Inventor: Henry Yang, Santa Clara, Calif.

[73] Assignee: OmniVision Technologies, Inc., Sunnyvale, Calif.

[21] Appl. No.: 774,738

[22] Filed: Jan. 2, 1997

[51] Int. Cl.⁶ .............................. G05F 1/40; H03L 5/00; H03K 5/08
[52] U.S. Cl. .......................... 323/274; 327/307; 327/313
[58] Field of Search ............................. 323/274; 327/307, 327/313, 321

[56] References Cited

U.S. PATENT DOCUMENTS

| | | | |
|---|---|---|---|
| 4,367,441 | 1/1983 | Niyda et al. | 328/162 |
| 4,373,140 | 2/1983 | Chin | 307/351 |
| 4,567,388 | 1/1986 | Jarrett et al. | 307/540 |
| 4,578,646 | 3/1986 | Maio et al. | 328/128 |
| 4,644,198 | 2/1987 | Ahmed | 307/549 |
| 4,727,332 | 2/1988 | Bundy | 328/169 |

*Primary Examiner*—Peter S. Wong
*Assistant Examiner*—Bao Q. Vu
*Attorney, Agent, or Firm*—Christensen, O'Connor, Johnson & Kindness PLLC

[57] ABSTRACT

A DC clamping circuit acting on an input signal to clamp the input signal to a voltage reference is disclosed. The DC clamping circuit comprises a comparator providing an output that decreases whenever the input signal is less than the output. A capacitor is connected to the output of the comparator for absorbing the charge output by the comparator. Finally, a differential amplifier is provided for subtracting the output of the comparator from the input signal and for adding the voltage reference.

4 Claims, 1 Drawing Sheet

DISCHARGE

ADAPTIVE DC CLAMPING CIRCUIT

TECHNICAL FIELD OF THE INVENTION

The present invention relates to clamping circuits, and more particularly, to a DC clamping circuit that can easily be implemented in a MOS integrated circuit.

BACKGROUND OF THE INVENTION

Clamping circuits are well known in the art. The function of a clamping circuit is to fix a time varying analog signal to a predetermined reference voltage such that the peak high or the peak low of the time varying analog signal is clamped to the reference voltage.

Although many prior art DC clamping circuits are known, many of these circuits are unsuitable for implementation in a MOS integrated circuit. The present invention discloses a simple DC clamping circuit that can be easily implemented in a MOS integrated circuit.

SUMMARY OF THE INVENTION

A DC clamping circuit acting on an input signal to clamp said input signal to a voltage reference is disclosed. The DC clamping circuit comprises a comparator providing an output that decreases whenever said input signal is less than said output; a capacitor connected to the output of said comparator for absorbing the charge output by said comparator; and a differential amplifier for subtracting the output of said comparator from said input signal and for adding said voltage reference.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
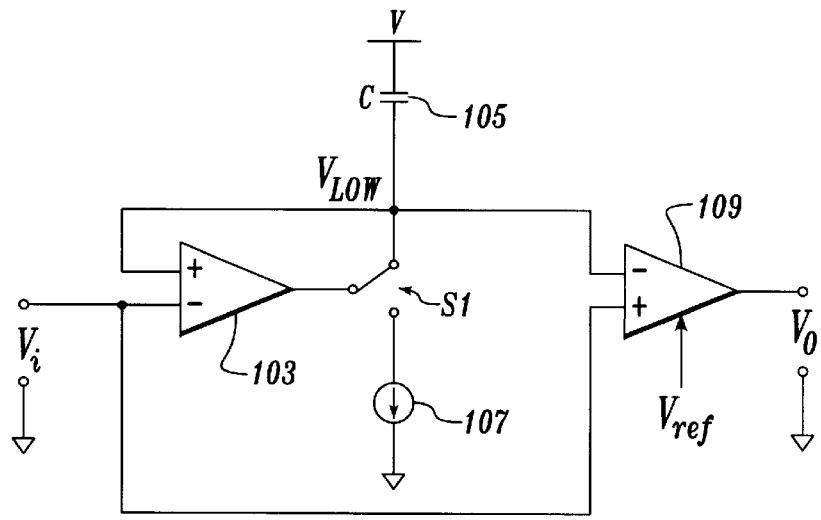
FIG. 1 is a schematic diagram of the preferred embodiment of the present invention.

The DC clamping circuit 101 of the present invention is shown in FIG. 1. The circuit 101 includes a comparator 103, a capacitor 105, a current source 107, and a differential amplifier 109. Also included is a switch $S_1$ that alternately connects one terminal of the capacitor 105 to the output of comparator 103 and the terminal of the current source 107.

An input signal $V_i$ that is to be clamped is provided to the inverting input of comparator 103 and also the non-inverting input of differential amplifier 109. The output of comparator 103 is fed back through switch $S_1$ to the non-inverting input of comparator 103. The voltage at the non-inverting input of comparator 103 is designated as $V_{LOW}$. $V_{LOW}$ is also provided as an input in the inverting input of differential amplifier 109.

Moreover, capacitor 105 is placed between $V_{LOW}$ and a pull-up voltage V. Typically, the capacitor 105 has a value of 100 picofarads to one microfarad and pull-up voltage V has a value of 5.0 volts. The capacitor 105 serves to store the voltage signal of the low level of the signal.

Also provided as an input to differential amplifier 109 is a reference signal $V_{REF}$. The voltage $V_{REF}$ is the voltage to which the output signal $V_o$ is clamped. Thus, by controlling $V_{REF}$, the DC clamping circuit 101 can operate to clamp the input signal $V_i$ to any voltage level. As can be appreciated, most commercially available amplifiers include an input port that allows its reference level to be set.

Assuming that the differential amplifier 109 has a gain of $A_v$, the output of differential amplifier 109, $V_o$, is:

$$V_O = V_{REF} + (V_i - V_{LOW})A_V$$

Figure 2A:
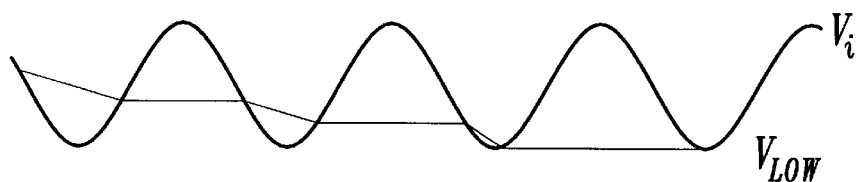
FIGS. 2A–2C are diagrams illustrating the clamping of an example time varying analog signal to a voltage reference, $V_{REF}$.
Figure 2B:
Figure 2C:
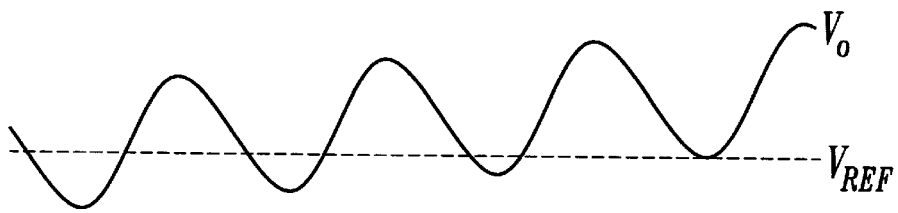

The operation of the DC clamping circuit 101 can best be seen in conjunction with FIGS. 2A–2C. As shown in FIG. 2A, the input signal $V_i$ is provided to the inverting input of comparator 103. Initially, the value of $V_{LOW}$ does not reach the peak low value of the input signal $V_i$. However, through several cycles, $V_{LOW}$ begins to match the peak low level of the input signal $V_i$.

The comparator 103 is operative such that when the input signal $V_i$ is less than the voltage $V_{LOW}$, then the output of comparator 103 becomes lower, causing $V_{LOW}$ to shift lower. This process continues until such point $V_i$ is greater than $V_{LOW}$. When $V_i$ is greater than $V_{LOW}$, $V_{LOW}$ is constant in accordance with the normal operation of a comparator. Eventually, after a few cycles, $V_i$ never becomes less than $V_{LOW}$, and $V_{LOW}$ becomes constant as seen in the latter part of FIG. 2A.

Moreover, as seen in FIG. 2B, when the input signal $V_i$ is less than the voltage $V_{LOW}$, switch $S_1$ is connected to the current source 107 allowing discharge of the previously absorbed charge. The timing of switch $S_1$ is controlled by the output of the comparator 103. When the input signal $V_i$ is less than $V_{LOW}$, the output of comparator 103 is high and the switch $S_1$ turns on to discharge the capacitor 105. This allows the charge that has been absorbed by capacitor 105 to be discharged, allowing capacitor 105 to continue absorbing additional charge from the output of comparator 103.

Turning now to FIG. 2C, the differential amplifier 109 provides an output $V_o$ that is dependent upon the difference between $V_i$ and $V_{LOW}$. As $V_{LOW}$ begins to drift downward (as seen in FIG. 2A) to the lowest peak value of $V_i$, the output voltage becomes an exact image of $V_i$ (multiplied by a gain factor $A_v$). Moreover, the output signal $V_o$ is shifted by $V_{REF}$. Therefore, it follows that over time, $V_o$ should be equivalent to the wave form $V_i$ but shifted to the reference voltage $V_{REF}$.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A DC clamping circuit acting on an input signal to clamp said input signal to a voltage reference, said DC clamping circuit comprising:

a comparator providing an output that decreases whenever said input signal is less than said output;

a capacitor connected to the output of said comparator for absorbing the charge output by said comparator; and a differential amplifier for subtracting the output of said comparator from said input signal and for adding said voltage reference.

2. The clamping circuit of claim 1 further including a current source connected to said output of said comparator and for periodically draining the charge from said capacitor.

3. The clamping circuit of claim 1 further including a pull-up voltage connected to said capacitor.

4. A DC clamping circuit acting on an input signal to clamp said input signal to a voltage reference, said DC clamping circuit comprising:

means for providing an output that decreases whenever said input signal is less than said output;

means connected to the output of said means for providing an output for absorbing the charge output by said means for providing an output; and means for subtracting the output of said means for providing an output from said input signal and for adding said voltage reference.

* * * * *